(12) United States Patent
Obara et al.

(10) Patent No.: US 11,721,520 B2
(45) Date of Patent: Aug. 8, 2023

(54) SEMICONDUCTOR DEVICE, MULTI-CHARGED-PARTICLE BEAM WRITING APPARATUS, AND MULTI-CHARGED-PARTICLE BEAM EXPOSURE APPARATUS

(71) Applicant: NuFlare Technology, Inc., Yokohama (JP)

(72) Inventors: Kei Obara, Kawasaki (JP); Kazuyuki Higashi, Yokohama (JP); Miyoko Shimada, Yokohama (JP); Yoshiaki Shimooka, Sagamihara (JP); Hitomi Yamaguchi, Yokohama (JP); Yoshikuni Goshima, Yokohama (JP); Hirofumi Morita, Setagaya-ku (JP); Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 6 days.

(21) Appl. No.: 17/581,079

(22) Filed: Jan. 21, 2022

(65) Prior Publication Data
US 2022/0270850 A1 Aug. 25, 2022

(30) Foreign Application Priority Data
Feb. 19, 2021 (JP) ................................ 2021-025289

(51) Int. Cl.
*H01J 37/317* (2006.01)
*H01J 37/04* (2006.01)

(52) U.S. Cl.
CPC ........ *H01J 37/3177* (2013.01); *H01J 37/045* (2013.01); *H01J 2237/0437* (2013.01); *H01J 2237/31776* (2013.01)

(58) Field of Classification Search
CPC ................. H01J 37/3177; H01J 37/045; H01J 2237/0437; H01J 2237/31776
See application file for complete search history.

(56) References Cited

U.S. PATENT DOCUMENTS

| 7,714,298 B2 | 5/2010 | Platzgummer |
| 2016/0064178 A1 | 3/2016 | Matsumoto et al. |

(Continued)

FOREIGN PATENT DOCUMENTS

| JP | 2016-054285 A | 4/2016 |
| JP | 2016-111046 A | 6/2016 |
| JP | 2017-216338 A | 12/2017 |

*Primary Examiner* — Sean M Luck
(74) *Attorney, Agent, or Firm* — Oblon, McClelland, Maier & Neustadt, L.L.P.

(57) ABSTRACT

A semiconductor device according to an embodiment includes: a substrate including a plurality of through holes provided at predetermined intervals along a first direction in a substrate surface and along a second direction intersecting the first direction in the substrate surface; an insulating layer provided on the substrate, the insulating layer being penetrated by the through holes; a plurality of first electrodes provided on the insulating layer, the first electrodes being adjacent to the respective through holes in the first direction; a plurality of second electrodes provided on the insulating layer, the second electrodes being adjacent to the respective through holes in the first direction, the second electrodes being provided to face the first electrodes, the second electrodes being held at a predetermined potential; and a wiring layer provided on the insulating layer, the wiring layer electrically connecting the adjacent second electrodes.

15 Claims, 10 Drawing Sheets

(56) References Cited

U.S. PATENT DOCUMENTS

2016/0155600 A1    6/2016   Chiba et al.
2017/0345612 A1   11/2017   Touya et al.
2017/0357153 A1* 12/2017   Platzgummer ............ G03F 1/78
2018/0374768 A1* 12/2018   Chiba ..................... H01L 29/06

* cited by examiner

SEMICONDUCTOR DEVICE, MULTI-CHARGED-PARTICLE BEAM WRITING APPARATUS, AND MULTI-CHARGED-PARTICLE BEAM EXPOSURE APPARATUS

CROSS-REFERENCE TO RELATED APPLICATION

This application is based upon and claims the benefit of priority from Japanese Patent Applications No. 2021-025289, filed on Feb. 19, 2021, the entire contents of which are incorporated herein by reference.

FIELD OF THE INVENTION

Embodiments described herein relate generally to a semiconductor device, a charged particle beam exposure apparatus, and a multi-charged-particle beam exposure apparatus.

The lithography technology playing a part in the progress of miniaturization of semiconductor devices is an extremely important process. In recent years, with an increase in the density of an LSI, the linewidth required for semiconductor devices has been reduced year by year. Since an electron beam exposure technique has essentially excellent resolution, a mask pattern is written on a mask blank using an electron beam.

A exposure apparatus using a multi-electron beam (multi-beam) can significantly improve a throughput as compared with the case of writing with a single electron beam. In such a writing apparatus of multi-beam type, for example, an electron beam emitted from an electron source is passed through a molded aperture having a plurality of holes to form a multi-beam. Each electron beam configuring the formed multi-beam is blanking-controlled by a blanking aperture array. The electron beam deflected by the blanking aperture array is shielded (blanking), and the electron beam not deflected by the blanking aperture array is radiated to a sample such as a mask blank.

The blanking aperture array is provided with through holes through which electron beams pass respectively. A pair of electrode for deflecting electron beam is provided around each of the through hole, respectively. In the manufacture of the blanking aperture array, for example, a method is adopted which forms each through hole and each electrode pair described above on a silicon (Si) substrate by using a semiconductor manufacturing technique.

SUMMARY OF THE INVENTION

A semiconductor device according to an embodiment includes: a substrate including a plurality of through holes provided at predetermined intervals along a first direction in a substrate surface and along a second direction intersecting the first direction in the substrate surface; an insulating layer provided on the substrate, the insulating layer being penetrated by the through holes; a plurality of first electrodes provided on the insulating layer, the first electrodes being adjacent to the respective through holes in the first direction; a plurality of second electrodes provided on the insulating layer, the second electrodes being adjacent to the respective through holes in the first direction, the second electrodes being provided to face the first electrodes, the second electrodes being held at a predetermined potential; and a wiring layer provided on the insulating layer, the wiring layer electrically connecting the adjacent second electrodes.

DETAILED DESCRIPTION OF THE EMBODIMENTS

Hereinafter, embodiments will be described with reference to the drawings. Incidentally, in the drawings, the same or similar parts are designated by the same or similar reference numerals.

In this specification, the same or similar members may be designated by the same reference numerals, and duplicate description may be omitted.

In this specification, in order to illustrate the positional relationship of parts and the like, the upper direction of the drawing is described as "upper", and the lower direction of the drawing is described as "lower". In this specification, the concepts of "upper" and "lower" do not necessarily indicate the relationship with the direction of gravity.

Hereinafter, a configuration using an electron beam will be described as an example of a charged-particle beam. However, the charged-particle beam is not limited to the electron beam, and may be a beam using charged-particles such as an ion beam.

First Embodiment

A semiconductor device according to this embodiment includes: a substrate including a plurality of through holes provided at predetermined intervals along a first direction in a substrate surface and along a second direction intersecting the first direction in the substrate surface; an insulating layer provided on the substrate, the insulating layer being penetrated by the through holes; a plurality of first electrodes provided on the insulating layer, the first electrodes being adjacent to the respective through holes in the first direction; a plurality of second electrodes provided on the insulating layer, the second electrodes being adjacent to the respective through holes in the first direction, the second electrodes being provided to face the first electrodes, the second electrodes being held at a predetermined potential; and a wiring layer provided on the insulating layer, the wiring layer electrically connecting the adjacent second electrodes.

Figure 1:
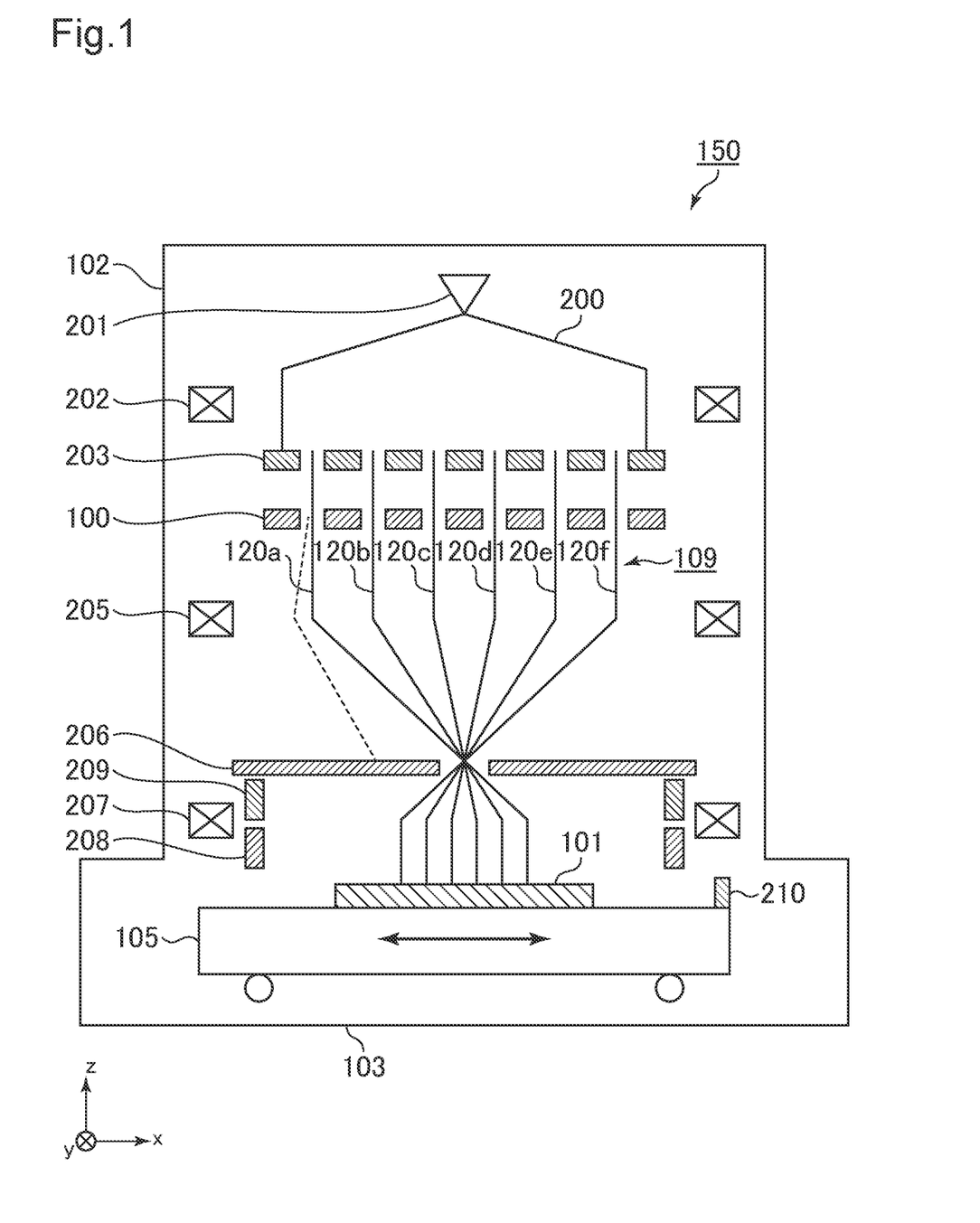
FIG. 1 is a schematic cross-sectional view of an electron beam writing apparatus according to a first embodiment.

FIG. 1 is a schematic cross-sectional view of an electron beam writing apparatus 150 according to this embodiment. The electron beam writing apparatus 150 is an example of a multi-charged-particle beam writing apparatus or a charged-particle beam exposure apparatus.

The semiconductor device 100 according to this embodiment is used, for example, as a blanking aperture array (deflector) of the electron beam writing apparatus 150. Incidentally, the application of the semiconductor device 100 is not limited to this.

The electron beam writing apparatus 150 includes an electron lens barrel 102 (multi-electron beam column) and a writing chamber 103. In the electron lens barrel 102, an electron source 201, an illumination lens 202, a shaping aperture array 203, a semiconductor device 100 (blanking aperture array), a reduction lens 205, a limiting aperture member 206, an objective lens 207, a main deflector 208, and a sub-deflector 209 are disposed.

Here, an x-axis, a y-axis intersecting the x-axis perpendicularly, and a z-axis intersecting the x-axis and the y-axis perpendicularly are defined. It is assumed that the electron source 201 emits an electron beam 200 in a z-axis direction. In addition, it is assumed that a sample 101 is disposed in a plane parallel to an xy plane.

The electron beam 200 emitted from the electron source 201 illuminates the shaping aperture array 203 substantially perpendicularly by the illumination lens 202. The electron beam 200 passes through an opening of the shaping aperture array 203 to form a multi-beam 109. The multi-beam 109 has electron beams 120a, 120b, 120c, 120d, 120e and 120f. The shape of each electron beam 120 reflects the shape of the opening of the shaping aperture array 203, and is, for example, a rectangular shape. Incidentally, although FIG. 1 illustrates six openings of the shaping aperture array 203, the present disclosure is not limited to this. Six multi-beams 109 formed by the shaping aperture array 203 are illustrated in FIG. 1. However, the number of the formed multi-beams 109 is not limited. As an example, 512 openings of the shaping aperture array 203 in each of an x-direction and a y-direction are disposed in a matrix.

The semiconductor device 100 is provided below the shaping aperture array 203. The electron beam 120 deflected by the semiconductor device 100 is displaced from the central hole of the limiting aperture member 206 and is shielded by the limiting aperture member 206. On the other hand, the electron beam 120 not deflected by the semiconductor device 100 passes through the central hole of the limiting aperture member 206. Accordingly, the on/off of the electron beam is controlled.

The electron beam 120 passing through the limiting aperture member 206 is focused by the objective lens 207 to form a pattern image having a desired reduction ratio, and is collectively deflected by the main deflector 208 and the sub-deflector 209. Then, irradiation is made on each irradiation position on the sample 101 placed on an XY stage 105. Further, a mirror 210 for measuring the position of the XY stage 105 is disposed on the XY stage 105.

Figure 2A:
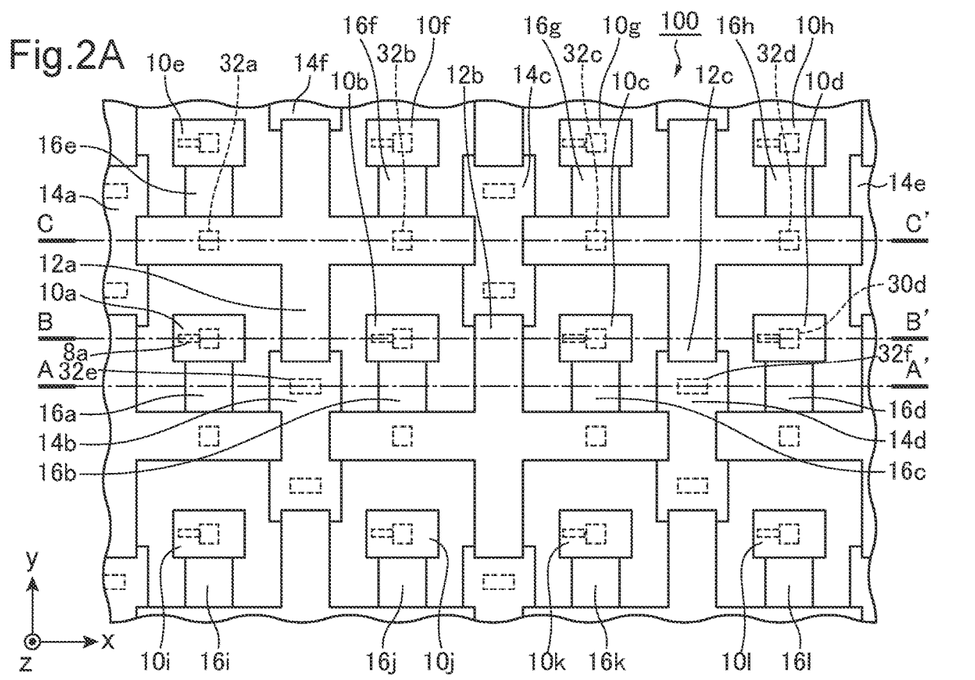
FIGS. 2A to 2D are schematic views of a semiconductor device according to the first embodiment.
Figure 2B:
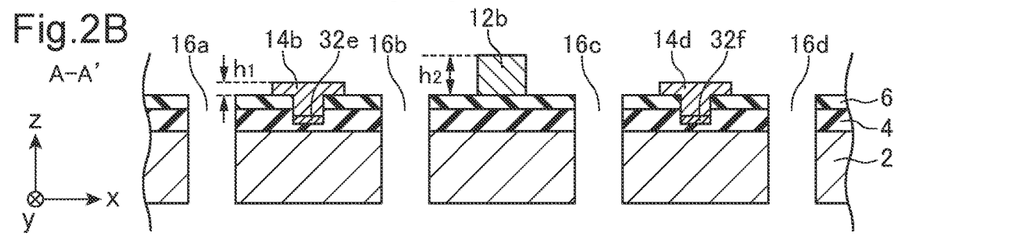
Figure 2C:
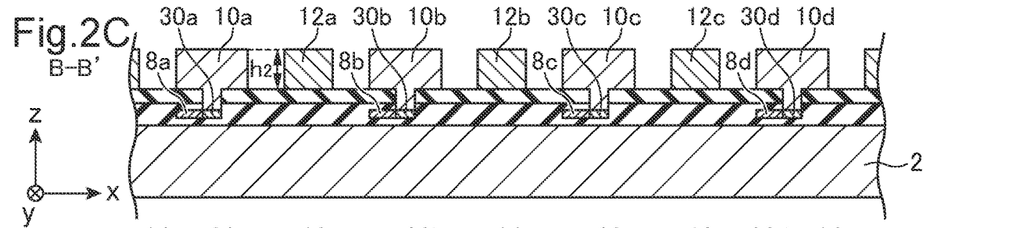
Figure 2D:
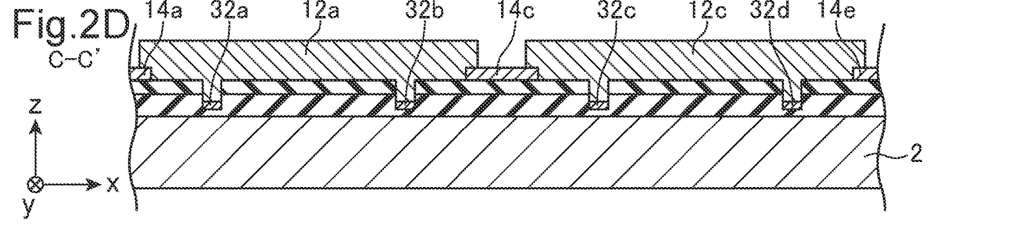

FIGS. 2A to 2D are schematic views of the semiconductor device 100 according to this embodiment. FIG. 2A is a schematic top view of the semiconductor device 100 according to this embodiment. FIG. 2B is a schematic cross-sectional view of the semiconductor device 100 in an A-A' cross section of FIG. 2A. FIG. 2C is a schematic cross-sectional view of the semiconductor device 100 in a B-B' cross section of FIG. 2A. FIG. 2D is a schematic cross-sectional view of the semiconductor device 100 in a C-C' cross section of FIG. 2A.

Figure 3A:
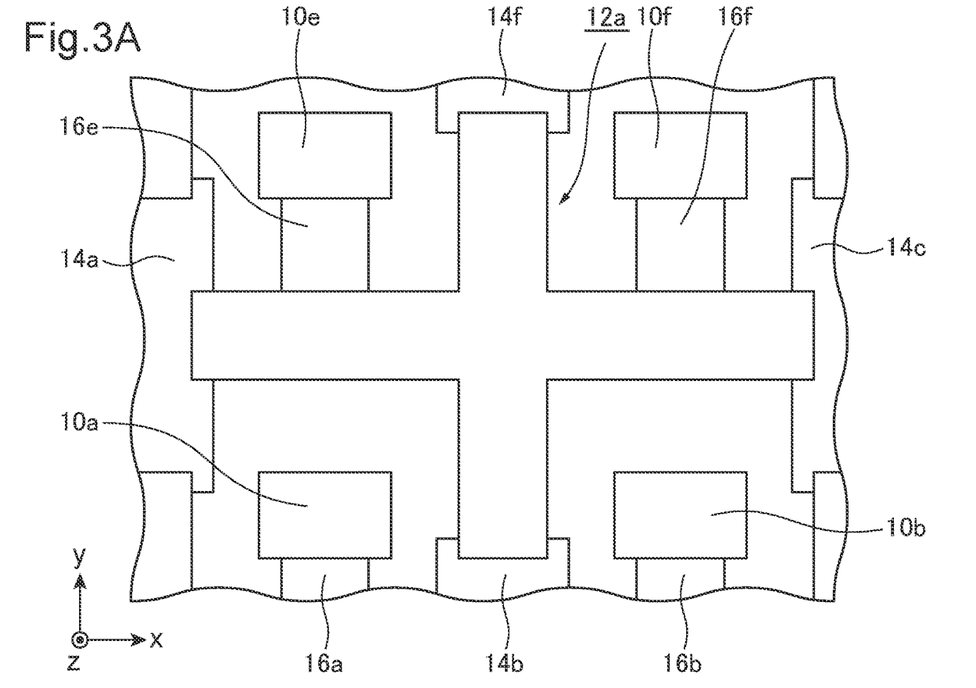
FIGS. 3A and 3B are schematic top views of a ground electrode and surroundings of the ground electrode according to the first embodiment.
Figure 3B:
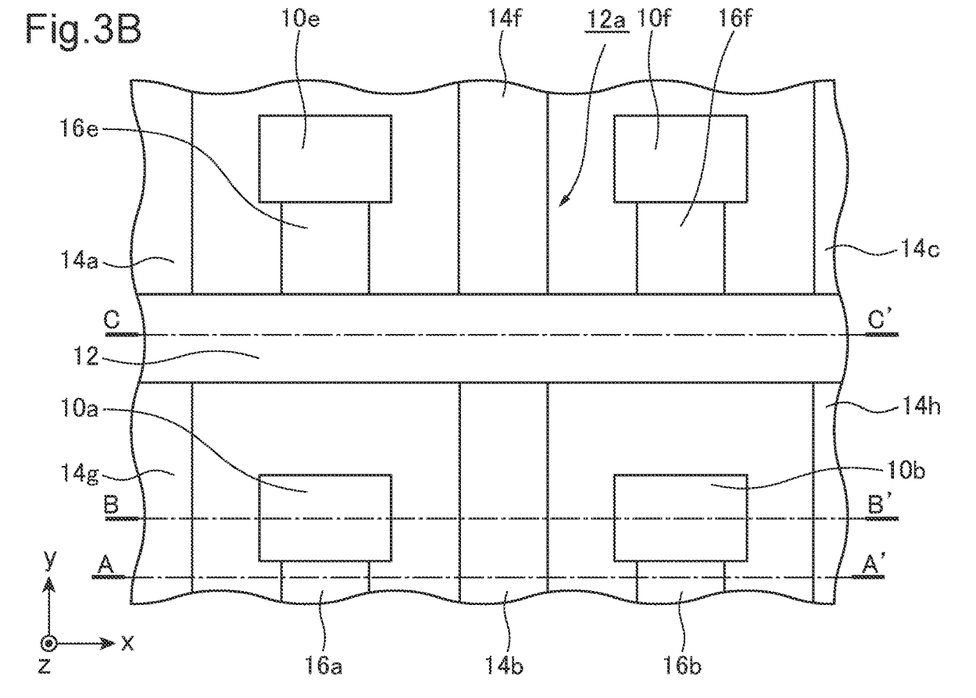

FIGS. 3A and 3B are schematic top views of a ground electrode 12 and surroundings of the ground electrode according to this embodiment.

Incidentally, in FIGS. 2A to 2D, 3A, and 3B, a first conductive layer 20, a second conductive layer 22, and an antistatic film 40 to be described later are not illustrated.

A substrate 2 is, for example, a semiconductor substrate. The substrate 2 is, for example, a silicon (Si) substrate.

Here, it is assumed that the surface (substrate surface) of the substrate 2 is disposed in a plane parallel to the xy plane. Therefore, both the x-direction and the y-direction are parallel to the substrate surface. However, of course, the disposition of the semiconductor device 100 is not limited to this. Incidentally, the y-direction parallel to the y-axis is an example of the first direction, and the x-direction parallel to the x-axis is an example of the second direction.

The substrate 2 is provided with a plurality of through holes 16 along the x-direction and the y-direction.

In FIG. 2A, through holes 16a to 16k and 16l are provided as the through holes 16. The through holes 16a, 16b, 16c and 16d are provided along the x-direction. The through holes 16e, 16f, 16g, and 16h are provided along the x-direction. The through holes 16i, 16j, 16k, and 16l are provided along the x-direction. The through holes 16i, 16a, and 16e are provided along the y-direction. The through holes 16j, 16b, and 16f are provided along the y-direction. The through holes 16k, 16c, and 16g are provided along the y-direction, and the through holes 16l, 16d, and 16h are provided along the y-direction.

A first insulating layer 4 is provided on the substrate 2. The first insulating layer 4 contains, for example, silicon oxide ($SiO_x$). However, the material of the first insulating layer 4 is not particularly limited to this.

A second insulating layer 6 is provided on the first insulating layer 4. The second insulating layer 6 is provided in order to suppress deterioration of a first connection wiring 30 and a second connection wiring 32 due to moisture absorption of the first insulating layer to be described later. The second insulating layer 6 contains, for example, silicon nitride ($SiN_x$). However, the material of the second insulating layer 6 is not particularly limited to this.

The first insulating layer 4, the first connection wiring 30, the second connection wiring 32, and the second insulating layer 6 on the substrate 2 are manufactured by LSI manufacturing technology.

Each of the plurality of through holes 16 also penetrates the first insulating layer 4 and the second insulating layer 6.

A plurality of control electrodes 10 are provided on the second insulating layer 6. The plurality of control electrodes 10 are provided adjacent to the plurality of through holes 16 in the y-direction, respectively. Incidentally, the control electrode 10 is an example of the first electrode.

The entire control electrode 10 including the surface or the inside is made of a conductive material. As the material of the control electrode 10, for example, gold (Au) is preferable since it is easy to form Au into an electrode having a high aspect ratio from the viewpoint of processing, and thus excellent electron beam deflection characteristics can be obtained. However, the material of the control electrode 10 is not particularly limited to Au.

The wiring layer 14 is provided on the second insulating layer 6 (on the first insulating layer 4) between the plurality of through holes 16 in the x-direction. For example, in FIG. 2A, the wiring layer 14b is provided between the through hole 16a and the through hole 16b. The wiring layer 14c is provided between the through hole 16f and the through hole 16g. The wiring layer 14d is provided between the through hole 16c and the through hole 16d.

The wiring layer 14 is made of a conductive material. For the wiring layer 14, for example, titanium nitride ($TiN_x$) is preferable since $TiN_x$ is easy to process and has stable characteristics. However, the material of the wiring layer 14 is not particularly limited to $TiN_x$.

The ground electrode 12 is provided on the second insulating layer 6. The ground electrode 12 is provided across the through hole 16 to face the control electrode 10 in the y-direction. Incidentally, the ground electrode 12 is an example of the second electrode, and the second electrode is held at a predetermined potential.

The ground electrode 12 is made of a conductive material. As the ground electrode 12, for example, gold (Au) is preferable since it is easy to form Au into an electrode having a high aspect ratio from the viewpoint of processing, and thus excellent electron beam deflection characteristics can be obtained. However, the material of the ground electrode 12 is not particularly limited to Au.

As illustrated in FIG. 3A, the ground electrode 12 has a cross shape. The four end portions of the ground electrode 12 having a cross shape are electrically connected to wiring layers 14a, 14b, 14c, and 14f, respectively.

Incidentally, the shape of the ground electrode 12 and the mode of the connection between the ground electrode 12 and the wiring layer 14 are not limited to this.

For example, as illustrated in FIG. 3B, the ground electrode 12 may have a line shape. In this case, the wiring layers 14a, 14g, 14f, 14b, 14c, and 14h are provided in a line shape extending in the y-direction to be connected to the ground electrode 12 having a line shape extending in the x-direction. With such a structure, the volume of the ground electrode can be reduced, a film stress can be reduced, and the warpage of the substrate can be suppressed.

The first connection wiring 30 is provided in the first insulating layer 4. For example, as illustrated in FIG. 2C, a part of the control electrode 10 penetrates the second insulating layer 6 and is electrically connected to the first connection wiring 30. A control electrode 10a is electrically connected to a first connection wiring 30a. A control electrode 10h is electrically connected to a first connection wiring 30b. A control electrode 10c is electrically connected to a first connection wiring 30c. A control electrode 10d is electrically connected to a first connection wiring 30d. As the material of the first connection wiring 30, for example, aluminum (Al) or copper (Cu) is preferable since it is easy to form Al or Cu into the first connection wiring 30. However, the material of the first connection wiring 30 is not particularly limited to aluminum (Al) or copper (Cu). In addition, the disposition or shape of the first connection wiring 30 and the mode of connection between the first connection wiring 30 and the control electrode 10 are not limited to those illustrated in FIGS. 2A and 2C.

For example, as shown in FIG. 2C, each of the control electrode 10 is electrically connected to control circuit via wiring portions 8a, 8b, 8c, and 8d of the control circuit, respectively, these wiring portions 8a, 8b, 8c, and 8d are provided in the first insulating layer 4. The wiring portion 8a is connected to the control electrode 10a via the first connection wiring 30a. The wiring portion 8b is connected to the control electrode 10b via the first connection wiring 30b. The wiring portion 8c is connected to the control electrode 10c via the first connection wiring 30c. The wiring portion 8d is connected to the control electrode 10d via the first connection wiring 30d. The control circuit 8 is, for example, a complimentary metal-oxide-semiconductor (CMOS) circuit. The control circuit 8 has a function of applying a predetermined voltage of, for example, about 5 V to the control electrode 10. Incidentally, the mode of the disposition and the mode of the connection with each of the control electrodes 10, of the wiring portions 8a, 8b, 8c, and 8d are not limited to those illustrated in FIGS. 2A and 2C.

Each of the electron beams 120 shaped by the shaping aperture arrays 203 passes through the through hole 16. Here, for example, when a predetermined voltage is applied to the control electrode 10 by the control circuit, an electric field is generated between the control electrode 10 and the ground electrode 12. The electron beam 120 passing through the through hole 16 in which the electric field is generated is deflected.

Incidentally, the electron beam 120 may pass from the upper surface (the surface on which the electrodes are formed) side of the substrate toward the back surface of the substrate 2, or may pass from the back surface side toward the upper surface.

The second connection wiring 32 is provided in the first insulating layer 4. When the semiconductor device 100 is provided in the electron beam drawing device 150, the second connection wiring 32 is grounded via a wiring (not illustrated). In FIG. 2B, second connection wirings 32e and 32f are provided. A part of the wiring layer 14b penetrates the second insulating layer 6 and is electrically connected to the second connection wiring 32e. In addition, a part of the wiring layer 14d penetrates the second insulating layer 6 and is electrically connected to the second connection wiring 32f. In the electron beam writing apparatus 150, the wiring layer 14b is grounded via the second connection wiring 32e, and the wiring layer 14d is grounded via the second connection wiring 32f. Therefore, the ground electrode 12 is grounded via the wiring layer 14.

In FIG. 2D, grounded second connection wirings 32a, 32b, 32c, and 32d are provided. A part of the ground electrode 12a penetrates the second insulating layer 6 and is electrically connected to the second connection wirings 32a and 32b. A part of the ground electrode 12c penetrates the second insulating layer 6 and is electrically connected to the second connection wirings 32c and 32d.

Incidentally, the shape of the second connection wiring 32 and the mode of connection between the second connection wiring 32 and the wiring layer 14 are not limited to those illustrated in FIGS. 2A, 2B, and 2D. In addition, the second connection wiring 32 is an example of the wiring.

It is preferable that, on the second insulating layer 6 on the first insulating layer 4, the wiring layer 14 has a portion, which is lower than the height of the control electrode 10 and the height of the ground electrode 12. By thinning the wiring layer 14, it is possible to suppress warpage caused by a stress difference from the substrate 2. In FIGS. 2B and 2C, the wiring layer 14b has a portion having a height $h^1$ lower than a height $h_2$ of the control electrode 10a and the ground electrode 12b. Incidentally, the height of the control electrode 10 and the height of the ground electrode 12 may not be the same, but it is preferably to be higher in order to obtain excellent electron beam deflection characteristics.

Figure 4:
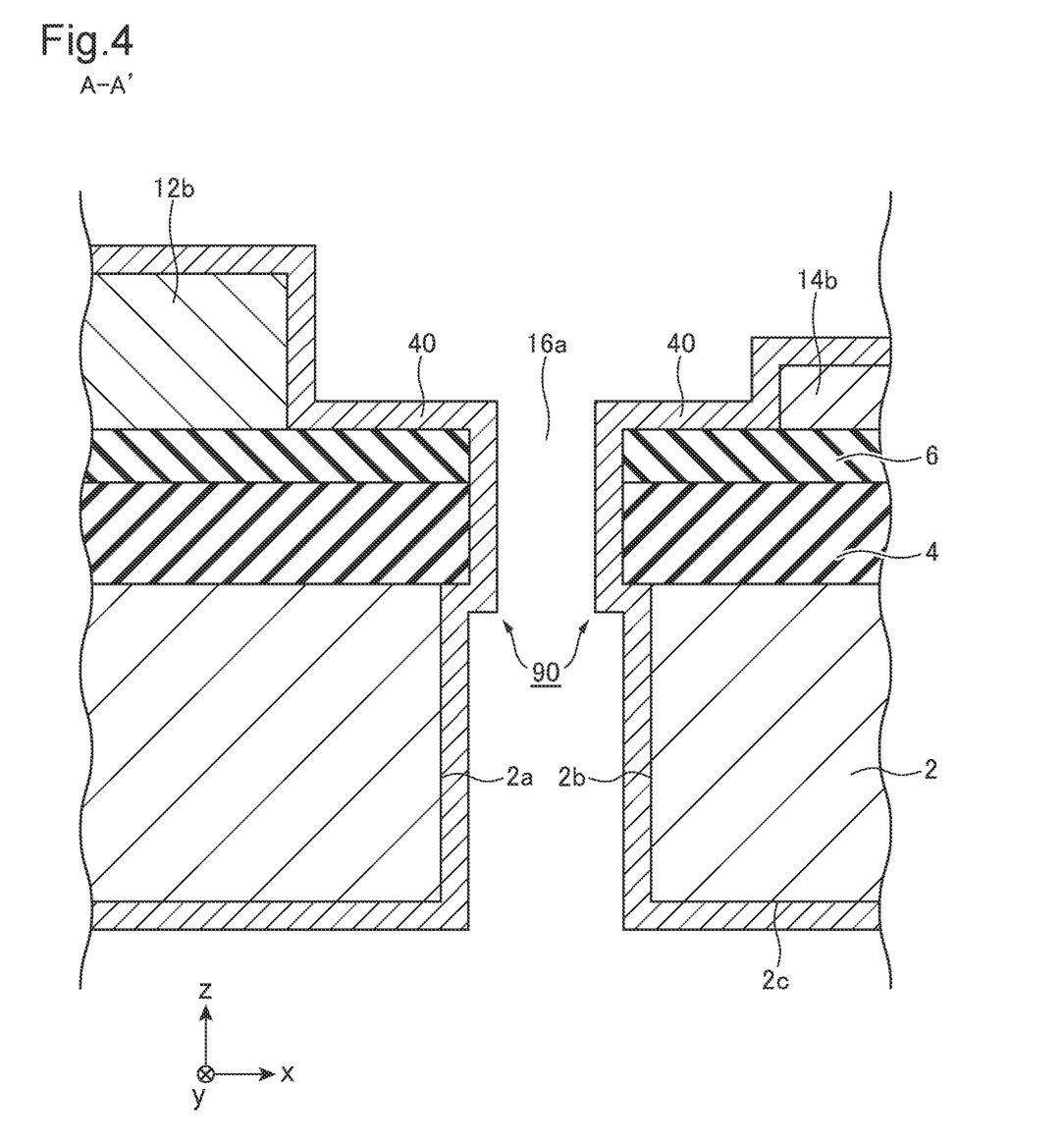
FIG. 4 is a schematic view of a through hole and the surroundings of the through hole according to the first embodiment.

FIG. 4 is a schematic view of the through hole 16a and the surroundings of the through hole 16a according to this embodiment in the A-A' cross section of FIG. 2A. Incidentally, in FIG. 4, the first conductive layer 20 and the second conductive layer 22 are not illustrated. The antistatic film 40 is provided on the upper surface of the second insulating layer 6 (the upper surface of the first insulating layer 4), the side surfaces of the first insulating layer 4 and the second insulating layer 6 in the through hole 16a, the side surfaces 2a and 2b of the substrate 2 in the through hole 16a, the back surface 2c of the substrate 2, the side surface and the upper surface of the ground electrode 12b, and the side surface and the upper surface of the wiring layer 14b. When the second insulating layer 6 and the side surface of the first insulating layer 4 in the through hole 16a are exposed, charging may cause an unintended deflection of the electron beam 120. In order to suppress this, it is preferable that the antistatic film 40 is provided except a case where the exposed area of the first insulating layer 4 and the second insulating layer 6 is extremely small and the influence of charging can be ignored. Incidentally, the antistatic film 40 may be provided on the upper surface and the side surface of the control electrode 10, but even in that case, it is preferable that the antistatic film 40 has a sufficiently high resistance to the extent that a leakage current does not interfere with the operation of a CMOS circuit.

As the material of the antistatic film 40, for example, platinum (Pt), Au, Ag, Cu, Fe, Cr, CrN, Ti, TiN, or TaN is preferable since Pt, Au, Ag, Cu, Fe, Cr, CrN, Ti, TiN, or TaN is difficult to oxidize, and excellent conductive characteristics can be obtained. However, the material of the antistatic film 40 is not particularly limited to the material containing these.

Figure 5:
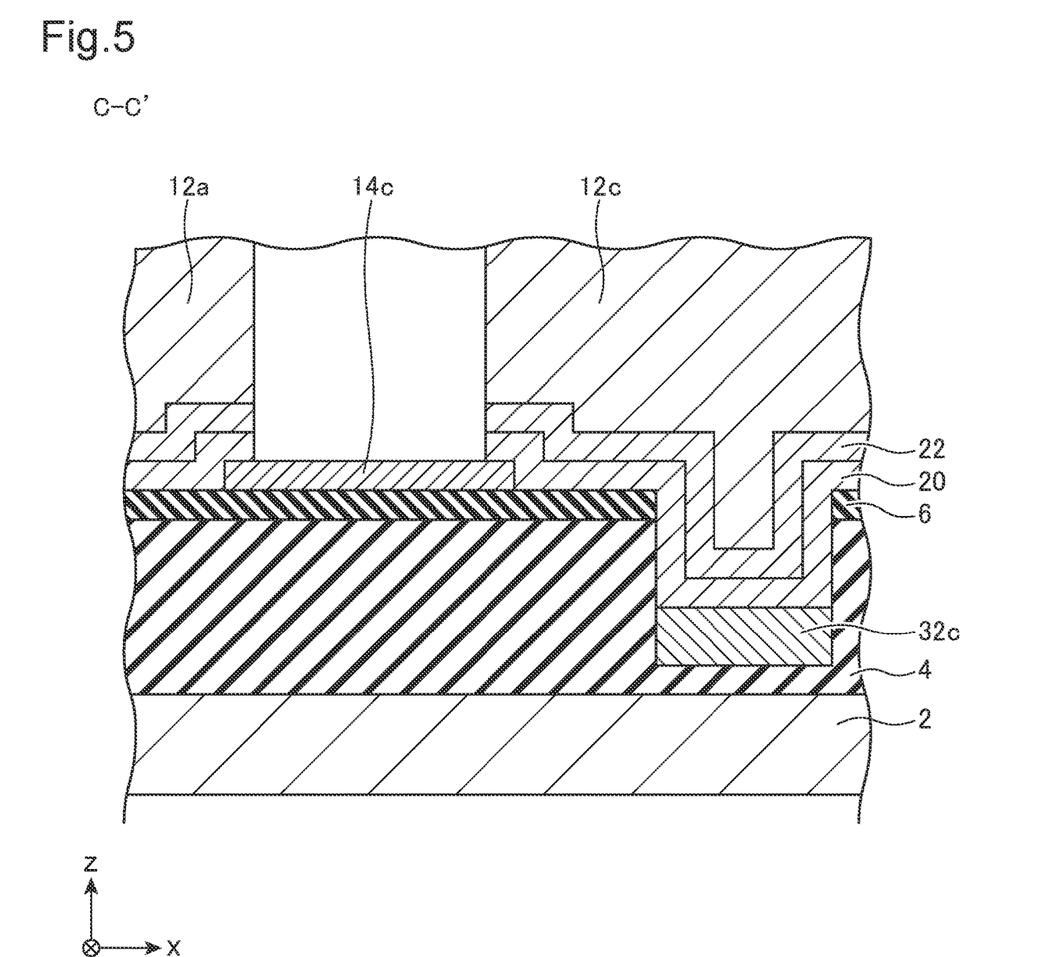
FIG. 5 is a schematic cross-sectional view illustrating a mode of connection between the ground electrode and a wiring layer, and a wiring according to the first embodiment.

FIG. 5 is a schematic cross-sectional view illustrating the mode of connection between the ground electrode 12 and the wiring layer 14, and the second connection wiring 32 according to this embodiment in the C-C' cross section of FIG. 2A. The first conductive layer 20 and the second conductive layer 22 are provided between the ground electrode 12a and the ground electrode 12c, and the second insulating layer 6 (first insulating layer 4). The ground electrode 12c, the first conductive layer 20, and the second conductive layer 22 penetrate the second insulating layer 6. The ground electrode 12c is electrically connected to the second connection wiring 32c via the first conductive layer 20 and the second conductive layer 22. In addition, a part of the first conductive layer 20 and the second conductive layer 22 is provided on the wiring layer 14c. The ground electrodes 12a and 12c are electrically connected to the wiring layer 14c via the first conductive layer 20 and the second conductive layer 22. Incidentally, the mode of connection between the control electrode 10 and the first connection wiring 30 is the same, and thus the illustration is omitted.

The first conductive layer 20 and the second conductive layer 22 are layers serving as bases when the control electrode 10 and the ground electrode 12 are formed by an electrolytic plating method. For example, in a case where the control electrode 10 and the ground electrode 12 are Au, it is preferable that the first conductive layer 20 contains titanium (Ti), and the second conductive layer 22 contains palladium (Pd) since the control electrode 10 and the ground electrode 12 are easy to form.

Figure 6A:
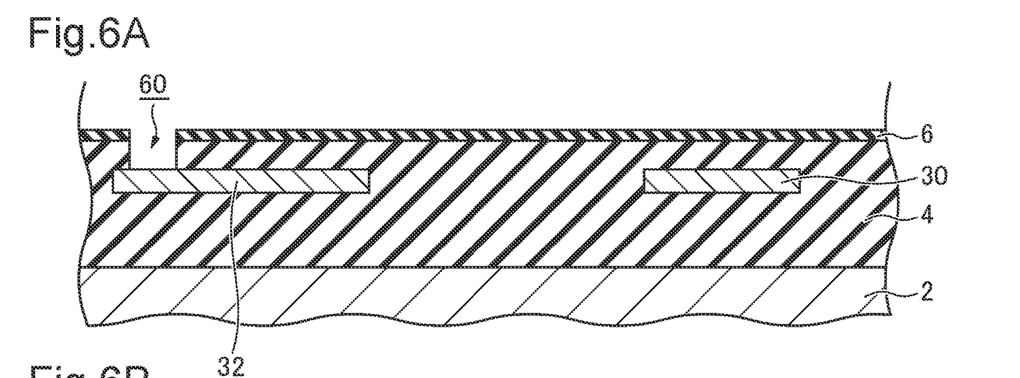
FIGS. 6A to 6C are schematic cross-sectional views illustrating a method for manufacturing a main part of the semiconductor device according to the first embodiment.
Figure 6B:
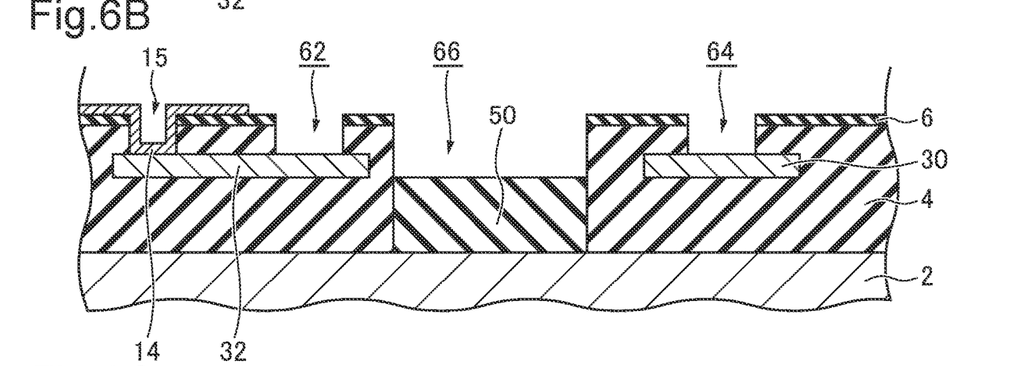
Figure 6C:
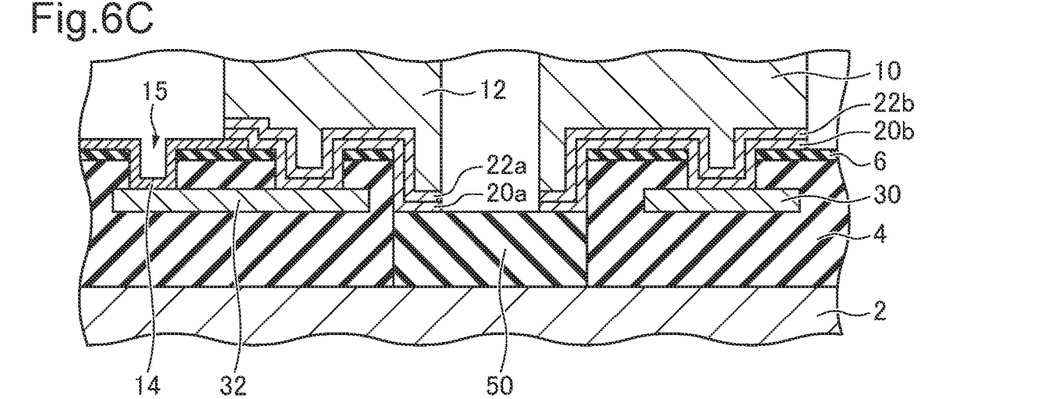

FIGS. 6A to 6C are schematic cross-sectional views illustrating a method for manufacturing a main part of the semiconductor device according to this embodiment. Incidentally, FIGS. 6A to 6C are schematic cross-sectional views for explaining an electrical connection between the wiring layer 14, the ground electrode 12, and the second connection wiring 32, and an electrical connection between the control electrode 10 and the first connection wiring 30, which does not mean that the actual semiconductor device 100 has a cross section as illustrated in FIGS. 6A to 6C.

First, the first insulating layer 4 provided on the substrate 2, the first connection wiring 30 and the second connection wiring 32 provided in the first insulating layer 4, and the second insulating layer 6 provided on the first insulating layer are formed. Next, a first opening 60 penetrating the second insulating layer 6 to reach the upper surface of the second connection wiring 32 is formed (FIG. 6A).

Next, the wiring layer 14 is formed over the upper surface of the second connection wiring 32, the side surface of the first opening 60, and the second insulating layer 6. Next, a second opening 62 penetrating the second insulating layer 6 to reach the upper surface of the second connection wiring 32 and a third opening 64 and a fourth opening 66 penetrating the second insulating layer 6 to reach the upper surface of the first connection wiring 30 are formed. Next, an insulating film 50 containing, for example, polyimide is formed in the fourth opening 66 (FIG. 6B).

Next, a first conductive layer 20a and a second conductive layer 22a are formed to extend over the upper surface of the second connection wiring 32, the side surface of the second opening 62, the second insulating layer 6, the wiring layer 14, the side surface of the fourth opening 66, and the insulating film 50, and a first conductive layer 20b and a second conductive layer 22b are formed to extend over the upper surface of the first connection wiring 30, the side surface of the third opening 64, the second insulating layer 6, the side surface of the fourth opening 66, and the insulating film 50. Next, the ground electrode 12 is formed with the first conductive layer 20a and the second conductive layer 22a as base layers by the electrolytic plating method. In addition, the control electrode 10 is formed with the first conductive layer 20b and the second conductive layer 22b as base layers by the electrolytic plating method. In this way, it is possible to electrically connect the wiring layer 14, the ground electrode 12, and the second connection wiring 32, and electrically connect the control electrode 10 and the first connection wiring 30. Incidentally, although a recess 15 is illustrated in the wiring layer 14 in FIGS. 6B and 6C, the wiring layer 14 may be formed after the first opening 60 is embedded with a conductive material.

Next, the operation and effect of the semiconductor device, the charged particle beam writing apparatus, and the multi-charged-particle beam exposure apparatus according to this embodiment will be described.

The silicon oxide used for the first insulating layer 4 has hygroscopicity. Therefore, there is a problem that the first connection wiring 30 and the second connection wiring 32 provided in the first insulating layer 4 may be corroded. In this regard, for the structure of the LSI, it is generally preferable that the second insulating layer 6 containing silicon nitride is provided on the first insulating layer 4 to suppress the moisture absorption of the first insulating layer 4.

However, silicon nitride has a substantially high electrical resistivity. Therefore, when the second insulating layer 6 is exposed, the second insulating layer 6 is easily charged to cause an unintended deflection of the electron beam. In addition, the side surface of the first insulating layer 4 in the through hole 16a is also charged to cause an unintended deflection of the electron beam. Therefore, it is preferable that the grounded antistatic film 40 is provided in the charged-particle beam exposure apparatus to suppress the charge of the second insulating layer 6.

Figure 7A:
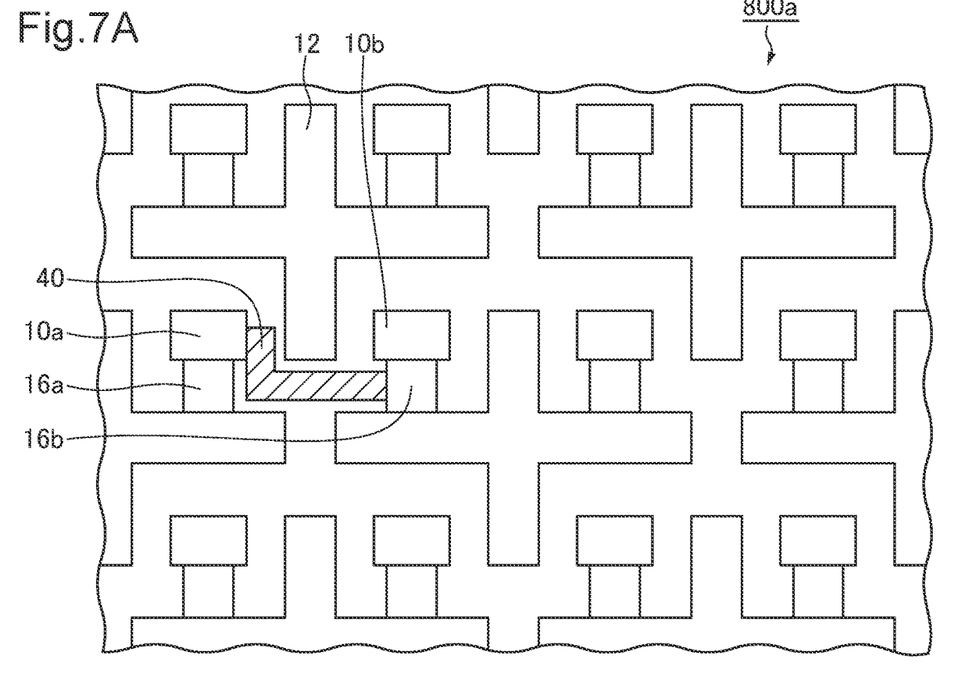
FIGS. 7A and 7B are schematic top views illustrating an operation and effect of the semiconductor device according to the first embodiment.
Figure 7B:
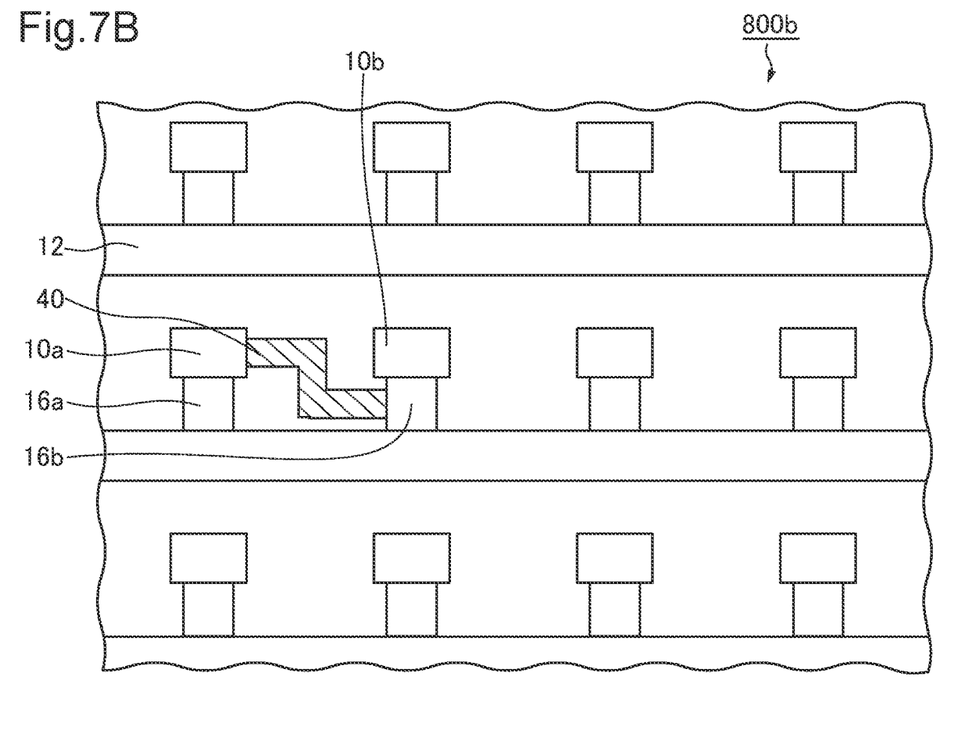

FIGS. 7A and 7B illustrate schematic top views of semiconductor devices 800a and 800b as comparative embodiments of this embodiment. In a case where the antistatic film 40 provided to prevent charging of the second insulating layer 6 is electrically connected to the control electrode 10a, when a voltage is applied to the control electrode 10a to control the electron beam 120 passing through the through hole 16a, a voltage is applied into the adjacent through hole 16b, and the resulting electric field causes an unintended deflection of the electron beam 120 passing through the through hole 16b. Even in a case where the antistatic film 40 is not provided, such a conduction path may be formed by the conductive residue generated in the process of forming the control electrode 10 or the ground electrode 12, the conductive particles adhering on the second insulating layer 6, or the like.

Figure 8:
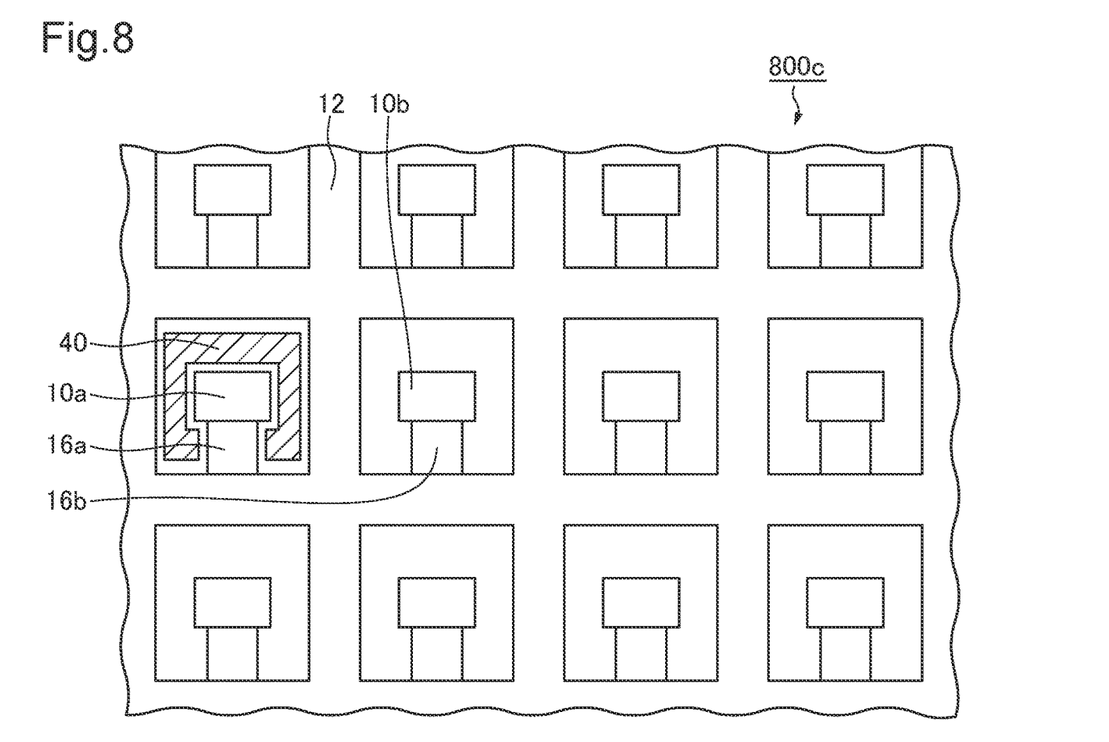
FIG. 8 is a schematic top view illustrating the operation and effect of the semiconductor device according to the first embodiment.
Figure 9A:
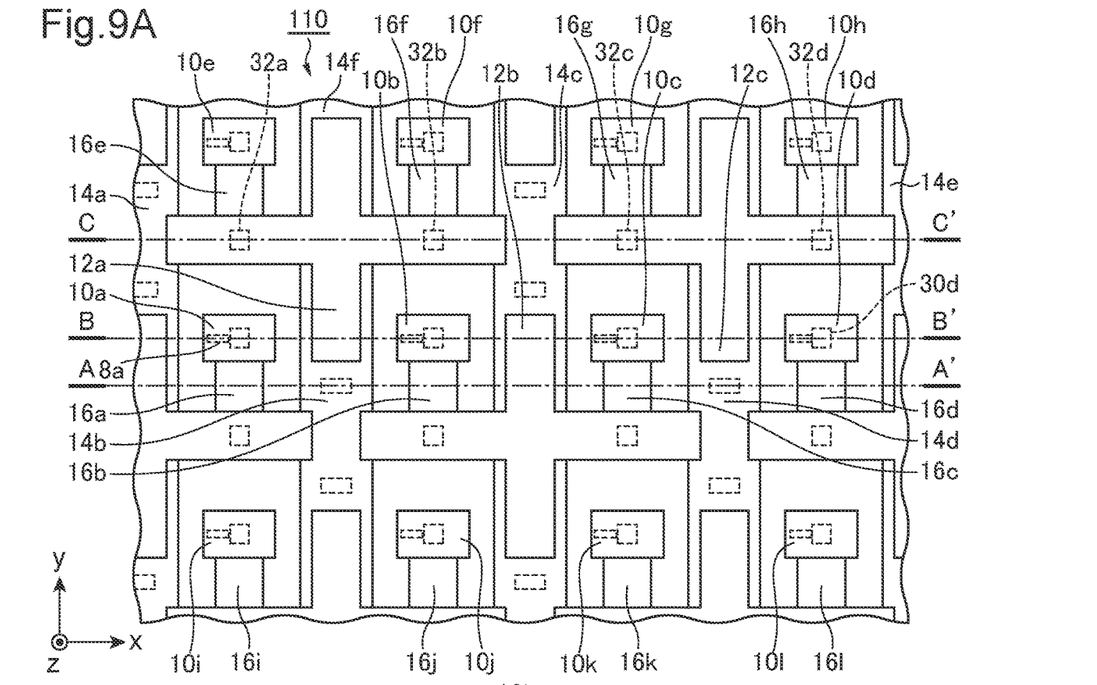
FIGS. 9A to 9D are schematic views of a semiconductor device according to a second embodiment.
Figure 9B:
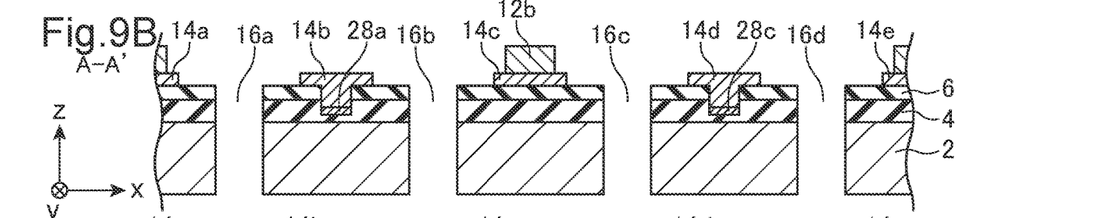
Figure 9C:
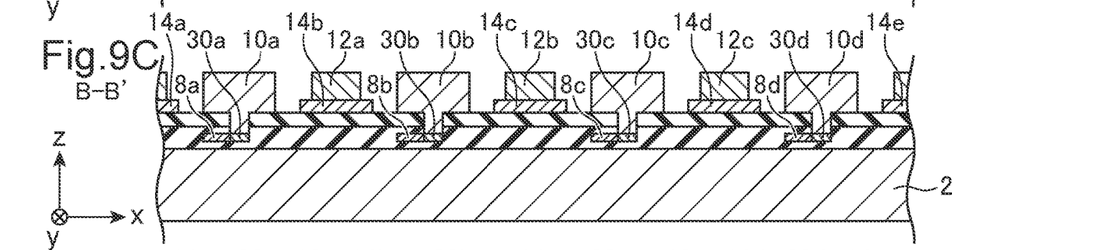
Figure 9D:
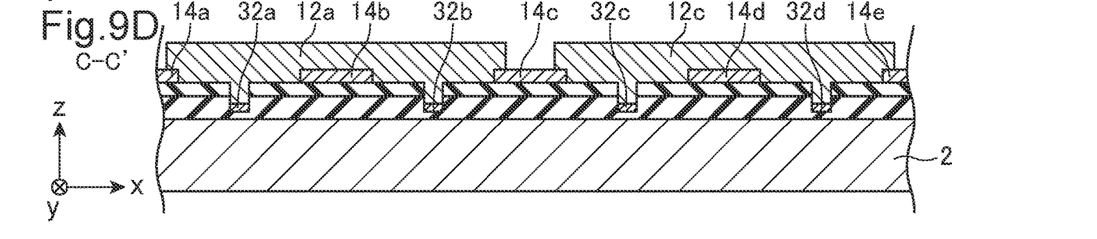
Figure 10A:
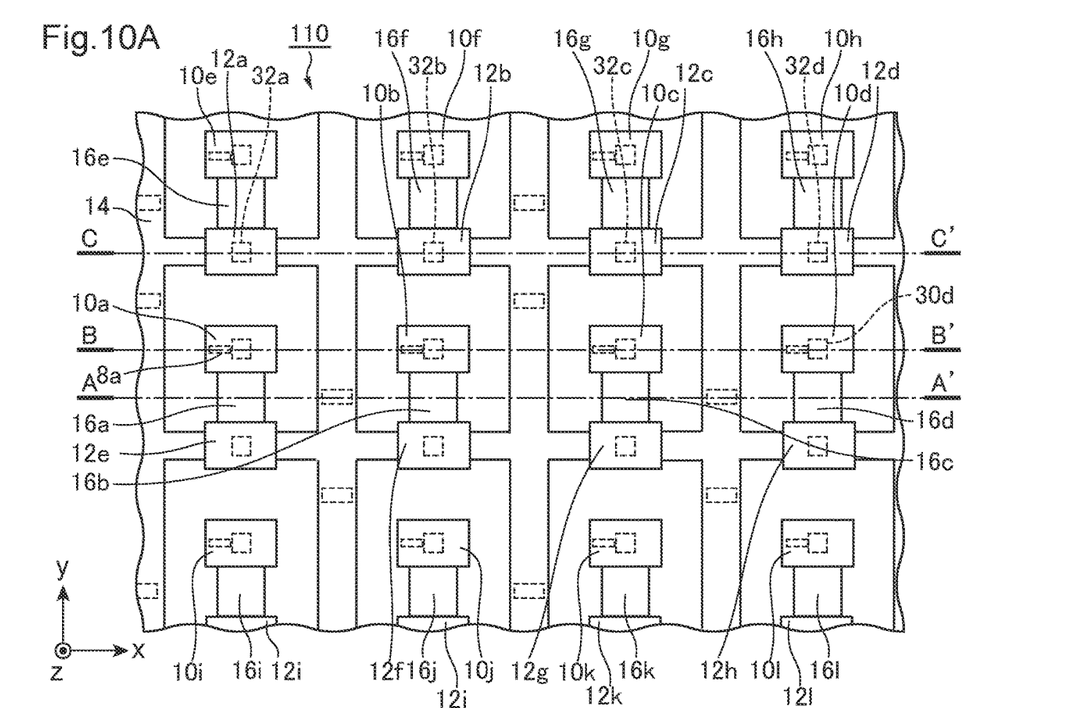
FIGS. 10A to 10D are schematic views of the semiconductor device according to the second embodiment.
Figure 10B:
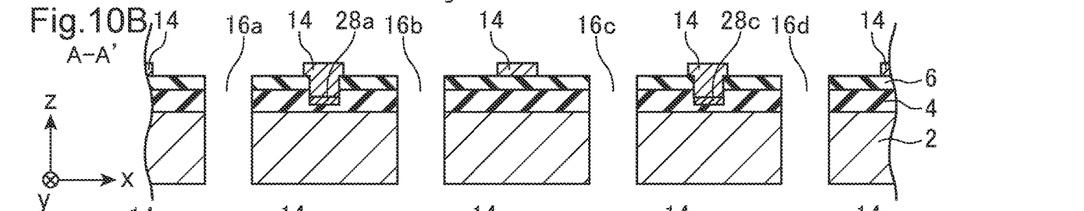
Figure 10C:
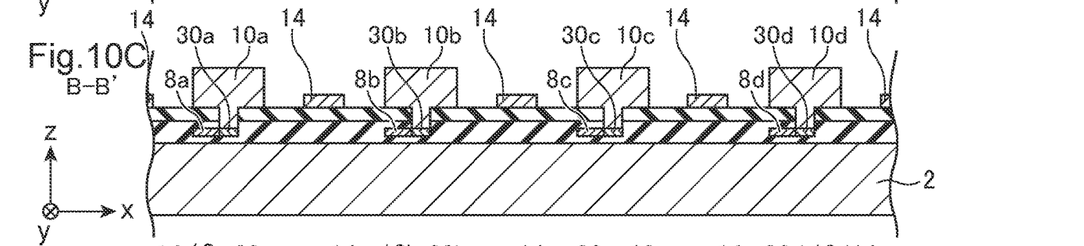
Figure 10D:
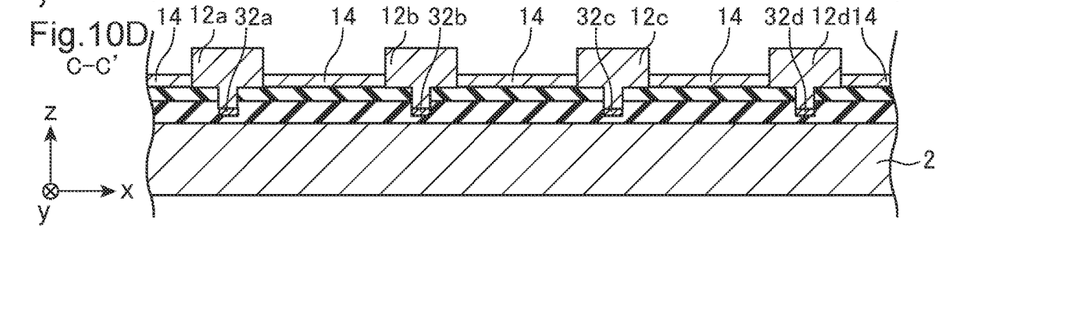

FIG. 8 illustrates a schematic top view of a semiconductor device 800c as a comparative embodiment. In the semiconductor device 800b, the ground electrode 12 is formed in a grid pattern, and the through hole 16 and the control electrode 10 are formed in each grid. The antistatic film 40 is provided, for example, around the through hole 16a and the control electrode 10a not to come into contact with the ground electrode 12. In this case, even when the antistatic film and the control electrode are unintentionally connected, the influence does not spread to the adjacent cells. However, since the volume of the ground electrode 12 increases, there is a problem that the influence of the difference between the stress of the material used for the ground electrode 12 and the stress of the substrate 2 becomes large, and the substrate 2 is warped.

The semiconductor device 100 according to this embodiment includes the wiring layer 14 to be grounded, the wiring layer being provided on the second insulating layer 6 between the plurality of through holes 16 in the x-direction. The ground electrode 12 is electrically connected to the wiring layer 14.

In the x-direction, the wiring layer 14 to be grounded is provided between the adjacent through holes 16. Since the wiring layer 14 is electrically connected to the ground electrode 12, and the voltage applied to the first electrode 10 is not applied to the adjacent through holes 16, the beams passing through the surrounding through holes are not affected. Therefore, even in a case where there is an unintended connection between the control electrode adjacent to a certain through hole and the antistatic film, the beams passing through the surrounding through holes are not affected. Therefore, it is possible to provide the semiconductor device and the charged-particle beam writing apparatus capable of suppressing the unintended deflection of a charged-particle beam.

By grounding the wiring layer 14 via the second connection wiring 32 provided in the first insulating layer 4, the wiring layer 14 can be grounded without another wiring.

Since the wiring layer 14 has a portion having a height lower than the height of the control electrode 10 or the height of the ground electrode 12, the volume of the ground electrode 12 provided on the substrate 2 can be reduced. Therefore, it is possible to suppress the warpage caused by the difference in stress between the ground electrode 12 and the substrate 2.

According to the semiconductor device, the charged-particle beam writing apparatus, and the multi-charged-particle beam exposure apparatus according to this embodiment, it is possible to provide the semiconductor device, the charged-particle beam writing apparatus, and the multi-charged-particle beam exposure apparatus capable of suppressing the unintended deflection of the charged-particle beam even in a case where the control electrode 10 and the antistatic film 40 are connected.

Second Embodiment

A semiconductor device according to this embodiment is different from the semiconductor device of the first embodiment in that the wiring layer 14 extends in the y-direction. Here, the points overlapping with the first embodiment will be omitted.

FIGS. 9A to 9D are schematic views of a semiconductor device 110 according to this embodiment. The wiring layer 14 extends in the x-direction and the y-direction. Accordingly, the wiring layer 14 and the ground electrode 12 are electrically connected, and the voltage applied to the first electrode 10 does not affect the adjacent through holes 16, and thus the beams passing through the surrounding through holes are not affected.

Similarly, the configuration in which the wiring layer 14 extends in the y-direction can be applied to a configuration in which the adjacent ground electrodes 12 are not connected. As illustrated in FIGS. 10A to 10D, each wiring layer 14 extends in the y-direction and is provided to make a connection between the ground electrodes 12 in the x-direction. Similarly, since the wiring layer 14 and the ground electrode 12 are connected, the voltage applied to the first electrode 10 does not affect the adjacent through holes 16, and thus the beams passing through the surrounding through holes are not affected.

According to the semiconductor device, the multi-charged-particle beam writing apparatus, and the multi-charged-particle beam exposure apparatus according to this embodiment, it is possible to provide the semiconductor device, the multi-charged-particle beam writing apparatus, and the multi-charged-particle beam exposure apparatus capable of suppressing the unintended deflection of the charged-particle beam.

Incidentally, the multi-charged-particle beam exposure apparatus includes the multi-charged-particle beam writing apparatus configured to write a mask pattern on a mask blank by using a charged-particle beam including an electron beam, and a multi-charged-particle beam inspection apparatus configured to inspect the mask pattern by detecting a secondary electron generated by irradiating the mask pattern with the electron beam.

The semiconductor device described in the above-described embodiment is applicable to the multi-charged-particle beam exposure apparatus. In other words, the semiconductor device described in the above-described embodiment is applicable to multi-charged-particle beam inspection apparatus in addition to the multi-charged-particle beam writing apparatus.

While certain embodiments and examples have been described, these embodiments and examples have been presented by way of example only, and are not intended to limit the scope of the inventions. Indeed, these novel embodiments may be embodied in a variety of other forms; furthermore, various omissions, substitutions and changes may be made without departing from the spirit of the inventions. The accompanying claims and their equivalents are intended to cover such embodiments or modifications as would fall within the scope and spirit of the inventions.

What is claimed is:
1. A semiconductor device comprising:
   a substrate including a plurality of through holes provided at predetermined intervals along a first direction in a plane direction of the substrate and along a second direction intersecting the first direction in the substrate surface;

an insulating layer provided on the substrate, the insulating layer being penetrated by the through holes;

a plurality of first electrodes provided on the insulating layer, the first electrodes being adjacent to the respective through holes in the first direction;

a plurality of second electrodes provided on the insulating layer, the second electrodes being adjacent to the respective through holes in the first direction, the second electrodes being provided to face the first electrodes, the second electrodes being held at a predetermined potential; and a wiring layer provided on the insulating layer, the wiring layer electrically connecting the adjacent second electrodes.

2. The semiconductor device according to claim 1, wherein the second electrode is grounded.

3. The semiconductor device according to claim 1, wherein the wiring layer extends in the first direction.

4. The semiconductor device according to claim 1, wherein the insulating layer includes a first insulating layer and a second insulating layer provided on the first insulating layer.

5. The semiconductor device according to claim 4, wherein the first insulating layer contains silicon oxide, and the second insulating layer contains silicon nitride.

6. The semiconductor device according to claim 1, further comprising: a wiring provided in the insulating layer, wherein the wiring layer is connected to the wiring.

7. The semiconductor device according to claim 6, further comprising: an antistatic film provided at least on an upper surface of the insulating layer.

8. The semiconductor device according to claim 1, wherein a height of the wiring layer is lower than a height of the second electrode.

9. The semiconductor device according to claim 1, wherein
the second electrodes are provided to be paired with the first electrodes, respectively, and
the wiring layer is provided to electrically connect with each of the second electrodes adjacent in the first direction and the second direction.

10. The semiconductor device according to claim 1, wherein
each of the second electrodes has a line shape extending in the second direction, the second electrodes being provided to face the first electrodes provided along the second direction, and
the wiring layer is provided to electrically connect with each of the second electrodes adjacent in the first direction.

11. The semiconductor device according to claim 1, wherein
the second electrode has a cross shape protruding in the first direction and the second direction,
at least one of portions protruding in the first direction is provided between regions where the adjacent through holes are provided respectively,
a portion protruding in the second direction is provided to be positioned to face the first electrode, and
the wiring layer is provided to electrically connect with each of the adjacent second electrodes.

12. The semiconductor device according to claim 1, wherein the wiring layer contains titanium nitride.

13. A multi-charged-particle beam writing apparatus comprising: the semiconductor device according to claim 1.

14. A semiconductor device, wherein the semiconductor device according to claim 1 is a semiconductor device for a multi-charged-particle beam exposure apparatus.

15. A multi-charged-particle beam exposure apparatus comprising: the semiconductor device according to claim 1.

* * * * *